United States Patent
Vollrath et al.

(10) Patent No.: US 6,816,094 B2
(45) Date of Patent: Nov. 9, 2004

(54) CIRCUIT CONFIGURATION FOR THE BIT-PARALLEL OUTPUTTING OF A DATA WORD

(75) Inventors: Joerg Vollrath, Olching (DE); Stephan Schröder, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/619,290

(22) Filed: Jul. 15, 2003

(65) Prior Publication Data

US 2004/0032352 A1 Feb. 19, 2004

(30) Foreign Application Priority Data

Jul. 15, 2002 (DE) .......................... 102 32 003

(51) Int. Cl.⁷ ................................................ H03M 9/00
(52) U.S. Cl. ..................................................... 341/100
(58) Field of Search ................................. 341/100, 101

(56) References Cited

U.S. PATENT DOCUMENTS 6,191,713 B1 * 2/2001 Ellis et al. .................. 341/100
6,288,656 B1 * 9/2001 Desai .......................... 341/100

FOREIGN PATENT DOCUMENTS

JP 10116491 A 5/1998
JP 10308096 A 11/1998

* cited by examiner

Primary Examiner—Brian Young
(74) Attorney, Agent, or Firm—Laurence A. Greenberg; Werner H. Stemer; Gregory L. Mayback

(57) ABSTRACT

A circuit configuration for the bit-parallel outputting the bits of a data word includes at least two signal lines for feeding the data signals representing the bits of the data word to driver stages and to a reference circuit. Further driver stages are connected in parallel with the driver stages and have inputs connected to the control device. The control device establishes the signal states of the data signals to be transferred on each signal line and generates a control signal depending on the type and number of the signal state changes of bit sequences to be transferred. It is possible to drive the driver stages that assigned to the signal line for which a signal state change is present.

5 Claims, 3 Drawing Sheets

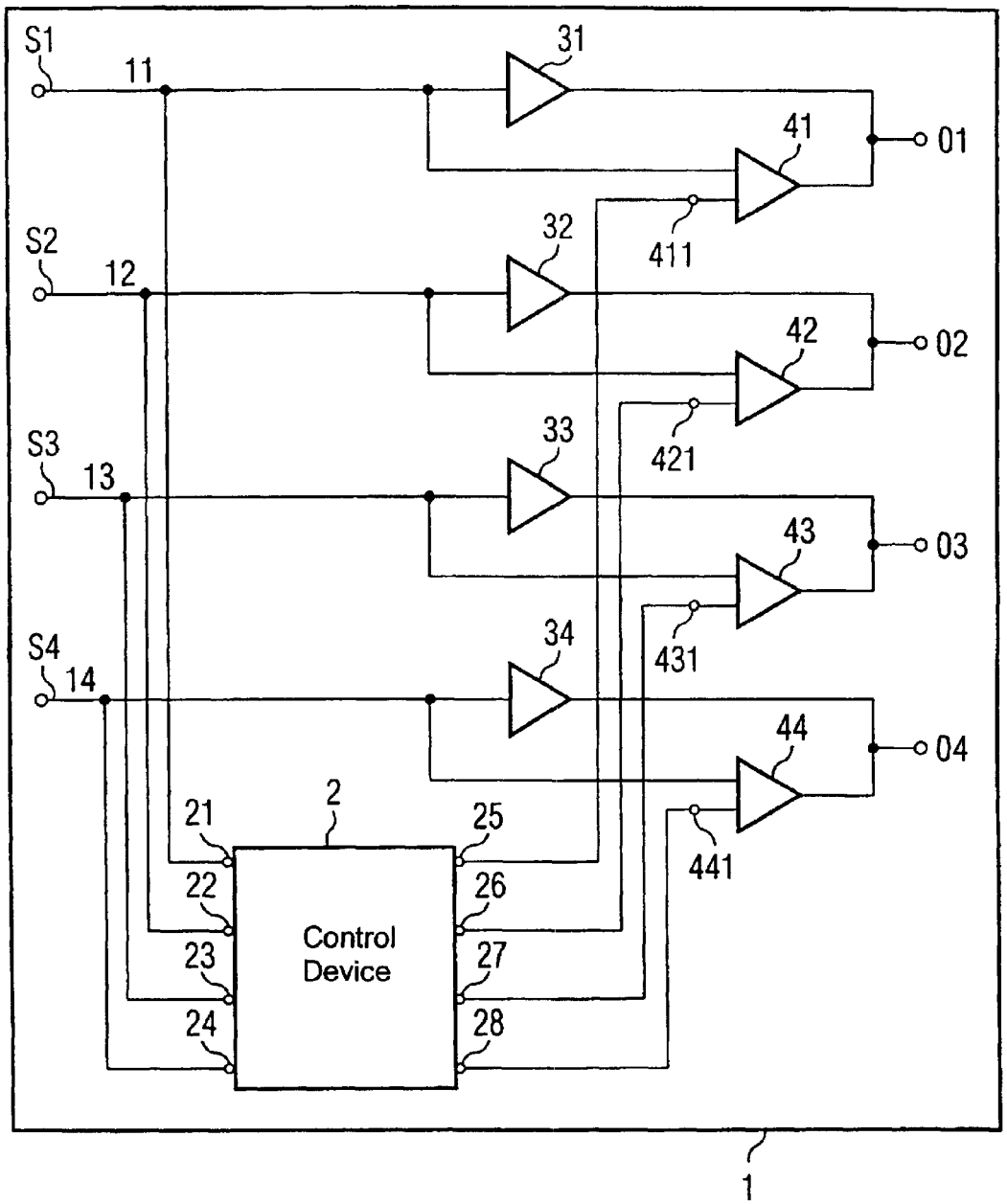

FIG 3

| SL | DW1 | DW2 | DW3 | SZP1 | SZP2 | SZW1 | SZW2 | Control Signals Generated After Transfer | | Driver Stages Transfer DW1 to DW3 | Additional Driver Stages Transfer | |
|----|-----|-----|-----|------|------|------|------|------|------|------|------|------|
| | | | | | | | | DW1 | DW2 | | DW2 | DW3 |
| S1 | 0 | 0 | 1 | 00 | 01 | 0 | 1 | - | 1 | 31=en | 41=dis | 41=en |
| S2 | 0 | 1 | 0 | 01 | 10 | 1 | 1 | - | - | 32=en | 42=dis | 42=dis |
| S3 | 0 | 0 | 1 | 00 | 01 | 0 | 1 | - | 1 | 33=en | 43=dis | 43=en |
| S4 | 0 | 0 | 0 | 00 | 00 | 0 | 0 | - | - | 34=en | 44=dis | 44=dis |

CIRCUIT CONFIGURATION FOR THE BIT-PARALLEL OUTPUTTING OF A DATA WORD

BACKGROUND OF THE INVENTION

Field of the Invention

The invention relates to a circuit configuration for the bit-parallel outputting of a data word.

The memory cells in a semiconductor memory are usually configured in a matrix-like grid of rows and columns. For reading out the information stored therein, provision is made of signal lines via which bit groups in the form of data words are transferred in parallel. Different logic states "0" and "1", which differ in terms of the voltage level, are transferred. The logic stage "0" corresponds to a voltage of 0 V, for example, and the logic stage "1" corresponds to a voltage of 2.5 V, for example.

Integrated circuits are operated with rising processing speeds and higher transfer frequencies in order to increase the data throughput. The data are transferred to the downstream peripherals via high-speed transfer links. High transfer frequencies, in particular, lead to increased distortion, interference and disturbance of the signals to be transferred and impair the signal quality and detectability.

Depending on the peripherals connected to the signal lines, different load behaviors result at the output drivers of a memory chip and substantially influence the output time behavior of the data to be transferred. The signals are transferred in a delayed manner in the case of a large output load, and, moreover, the signal characteristics, such as the steepness of rising and falling edges, for example, are altered or distorted. The number of signal states that change during the transfer of a data word, such as, for example, the signal state change from a logic "0" to a logic "1", and vice versa, influences the signal output characteristics, in particular also the time behavior during the signal outputting. By way of example, in the case of a data word in which all the bits have the logic value "1", the signal states of the data word bits to be transferred in parallel bring about a retarded outputting compared with data words in which the bits have mixed signal states with logic "1"s and logic "0"s. For the amplification of a signal to be transferred, amplifier stages are connected downstream of the memories and amplify an applied signal by a defined factor corresponding to the specifications.

The operation of one or more amplifier stages in high-frequency circuit environments increasingly requires a very fast changeover of changing signal states, in particular in order to improve the output signal characteristics. Various types of amplifier circuits are used for reading out data of, for example, an integrated semiconductor memory.

For the purpose of reading out a bit of a data signal, an amplifier is connected to a data line on which the signal representing a bit is transferred. In an integrated memory with a matrix-type memory cell array, the memory cells are assigned to word lines and bit lines (or row and column lines). The transferred data are in each case detected and amplified by a sense amplifier. The data are forwarded via a plurality of functional units which set the data read path to downstream amplifier or driver stages, so-called output drivers. Many of the output drivers have complementary field-effect transistors of a p-channel type and an n-channel type that are connected in series. A plurality of identical transistors which represent a further amplifier stage may be connected in parallel with the p-channel and n-channel field-effect transistors.

An input signal applied to an amplifier stage is amplified by a specific factor. Hitherto, only in the production process has it been possible to set and alter the driver strength of an amplifier stage and also the number of effective amplifier stages of a circuit configuration. For a correspondingly required output power of an amplifier stage, the gain factor is determined depending on manufacturing tolerances and component specifications in the manufacturing process. In addition, in the manufacturing process it is possible to alter the number of abovementioned field-effect transistors connected in parallel with the main transistors and hence the number of amplifier stages by connecting or disconnecting interconnect runs. The driver strength is set by the connection or disconnection of field-effect transistors connected in parallel. However, the driver strength can no longer be altered after the conclusion of the manufacturing process. Consequently, the gain factor of an amplifier stage is fixedly predetermined. The amplifier stages found in integrated circuits do not enable requirement-conforming connection or disconnection of amplifier stages in order to adapt signal characteristics and throughput speeds at the transfer points, the so-called pads.

SUMMARY OF THE INVENTION

It is accordingly an object of the invention to provide a circuit configuration that is suitable as an amplifier stage, that avoids propagation time delays during the bitwise parallel transfer of a data word, and that improves signal quality.

With the foregoing and other objects in view there is provided, in accordance with the invention, a circuit configuration for outputting bits of a data word in parallel. The configuration includes a plurality of signal lines for providing data signals in parallel. The data signals represent at least two bits of a data word that includes at least two bits. The configuration includes: a plurality of output terminals for providing amplified data signals representing the bits of the data word; and a control device having at least two outputs for outputting a respective control signal. The control device has at least two inputs connected to the signal lines. The control device is for determining signal states of data signals representing bits of two directly successive data words on the plurality of signal lines. The configuration also includes a plurality of driver stages having inputs for obtaining the data signals from the plurality of signal lines. The plurality of driver stages have outputs connected to the plurality of output terminals. The configuration also includes a plurality of additional driver stages, connected in parallel with the inputs and the outputs of the plurality of the driver stages. Each one of the plurality of additional driver stages is connected in parallel with a respective one of the plurality of the driver stages. The control device is for generating a plurality of control signals for enabling or switching off the plurality of additional driver stages. Each one of the plurality of the additional driver stages has an input connected to a respective one of the outputs of the control device for receiving one of the plurality of control signals generated by the control device.

The circuit configuration can advantageously be used for the additional amplification of the data signals to be transferred on the signal lines in that, by using control signals of the upstream control device, the additional driver stages can additionally be connected in parallel with the respective main transistors or first and further driver stages and thus perform an additional amplification of the data signals to be transferred.

The outputting of a data word from a semiconductor memory may be effected, for example, by using data words having a width of 4, 8 or 16 bits. That is to say that the outputting of the data word is effected bitwise in parallel via a corresponding number of signal lines. The data signals—representing the bits of the data words to be transferred—are fed in parallel via a corresponding number of signal lines to the control device. The control device performs, on each signal line, an evaluation of the signal state changes of the data signals representing the bits of directly successive data words. Depending on the evaluation result, the control device generates a control signal that is fed to the downstream additional driver stages in order to switch the latter on or off. If signal state changes of two data words that are to be transferred directly in succession are present on two signal lines, the control device drives those additional driver stages that are assigned to the signal path for which a signal state change is present within the signal state pairs. By way of example, if signal state changes of two data words that are to be transferred directly in succession are present on three signal lines, the control device drives those additional driver stages which are assigned to those signal paths for which identical signal state changes are present within the signal state pairs. That is to say, either a rising edge followed by a falling edge of a data signal or a falling edge followed by a rising edge of a data signal. If signal state changes of two data words that are to be transferred directly in succession are present on more than three signal lines, the control device drives those additional driver stages that are assigned to the signal path for which a signal state change is present within the signal state pairs.

During the operation of the first and further driver stages, it is now possible to perform the amplification of the data word present in bit-parallel fashion on the signal lines in an adapted manner, depending on the number of state changes of the bits within the signal state pairs of data signals to be transferred, in order to reduce delayed signal outputs. The circuit takes account of the requirement of performing an additional amplification of the signal edges during the transfer of changing signal states on each individual signal line, in order to improve the signal quality.

Other features which are considered as characteristic for the invention are set forth in the appended claims.

Although the invention is illustrated and described herein as embodied in a circuit configuration for the bit-parallel outputting of a data word, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a block diagram of the inventive circuit configuration;

FIG. 3 is a table representing the function of the circuit configuration; and

DESCRIPTION OF THE PREFERRED EMBODIMENTS

Figure 1:
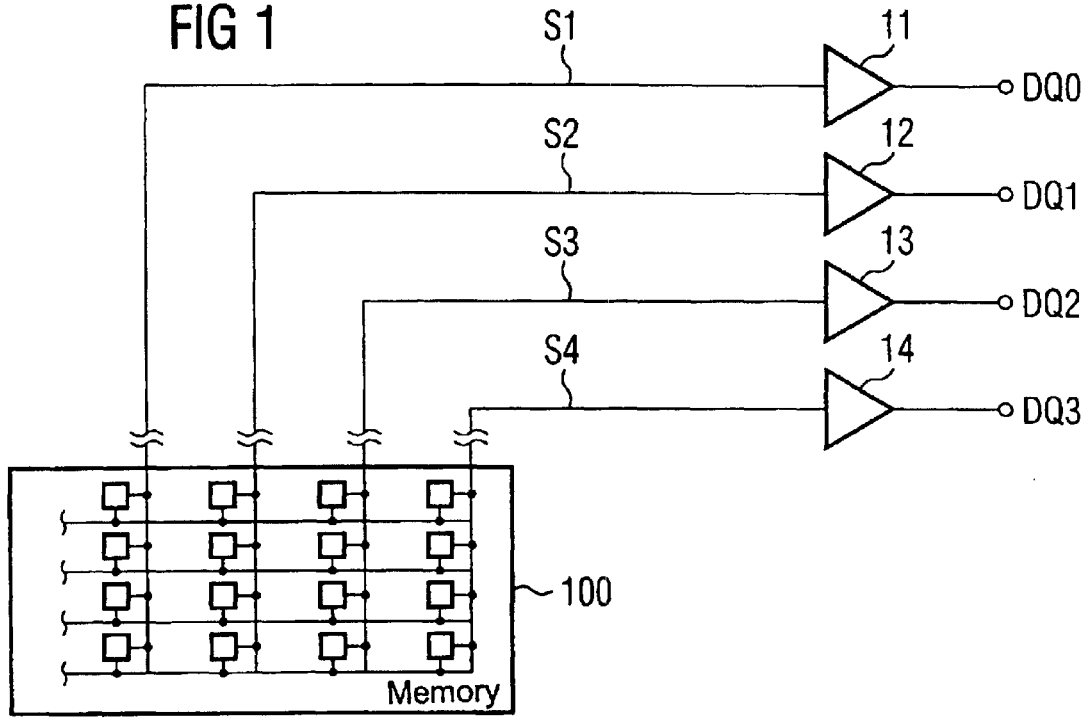
FIG. 1 is an example of the application of output driver stages.

Referring now to the figures of the drawing in detail and first, particularly, to FIG. 1 thereof, there is shown an example of the application of output driver stages for a semiconductor memory. The circuit configuration shown here represents a four-bitwise organized memory 100, in which the data words are stored as a corresponding charge value. The individual bits of a data word are output via the signal lines S1, S2, S3 and S4 in bit-parallel fashion. This means that the bits of a data word are output simultaneously. Driver stages 11, 12, 13 and 14 serve for driving the data words read from the memory 100. A plurality of amplifier stages and functional units which set the data read path are located between the memory cells and the driver stages. The driver stages are also referred to as off-chip drivers. The data are output from the driver stages 11, 12, 13 and 14, after being read-out from the memory 100 with a sufficient signal level, to conductor tracks of a circuit board and are transferred to downstream components. In particular when driving directly successive data words having changing states of the bits being transferred on a plurality of signal lines, the amplifier stages embodied in accordance with a specific specification lead to an impairment of the signal quality and delay the signal outputting on account of reduced overall driver strength.

FIG. 2 is a block diagram illustrating an inventive circuit configuration 1. The inputs of a first and further amplifier stages 31, 32, 33 and 34 are connected to the signal lines S1, S2, S3 and S4 for the bitwise feeding of the data signals 11, 12, 13 and 14 of a data word comprising four bits. The outputs of the amplifier stages 31, 32, 33 and 34 are connected to the output terminals O1, O2, O3 and O4 for forwarding the amplified data signals. The driver stages 31, 32, 33 and 34 are switched on, in principle, and amplify the data signals 11, 12, 13 and 14 present at their inputs.

The data signals 11, 12, 13 and 14—representing a respective bit—of the data word comprising four bits are fed to the inputs 21, 22, 23 and 24 of a control device 2 via the signal lines S1, S2, S3 and S4. The inputs and the outputs of the additional driver stages 41, 42, 43 and 44 are connected in parallel with the first and further driver stages 31, 32, 33 and 34. The input terminals 411, 421, 431 and 441 of the additional driver stages 41, 42, 43 and 44 are connected to the output terminals 25, 26, 27 and 28 of the upstream control device 2. Via its inputs 21, 22, 23 and 24, the control device 2 establishes the signal states of the data signals 11, 12, 13 and 14—representing the bits—of two directly successive data words in the form of signal state pairs. If a signal state change occurs within the signal state pairs on more than two signal lines, the control device 2 can drive those additional driver stages 41, 42, 43 and 44 which are assigned to the signal line S1, S2, S3 and S4 affected by the signal state change. The control signals applied to the inputs 411, 412, 413 and 414 of the additional driver stages 41, 42, 43 and 44 by the control device 2 bring about a disconnection or connection of the driver stages and, consequently, a reduced or increased gain.

The abbreviations used in the first line of FIG. 3 have the following meanings:

SL means signal line and relates to the signal lines S1, S2, S3 and S4 on which the bits of a data word are present in parallel. DW1 means first data word, DW2 means second data word and DW3 means third data word. The data words DW1 to DW3 are transferred directly in succession, being applied to the signal lines S1 to S4 bitwise in parallel. SZP1 means first signal state pair and SZP2 means second signal state pair. A directly successive transfer of the data signals—representing the bits—of two data words makes it possible to establish a signal state pair on each signal line. SZW1 means first signal state change and SZW2 means second signal state change. A signal state change relates to the change of the signal states within an established signal state pair. There are two types of signal state changes: a rising edge of one of the data signals followed by a falling edge of the data signal or a falling edge of one of the data signals followed by a rising edge of the data signal. In accordance with columns 307 and 308, a change of the signal states within the signal state pairs is represented as binary "1", and constant states are represented as binary "0". In columns 310 and 311, the expression "en" means switched on and the expression "dis" means switched off. During the transfer of the data words DW1 to DW3, the driver stages 31 to 34, in accordance with column 310, are switched on, in principle. The control signals generated depending on the type and number of the parallel signal state changes are likewise represented as binary "1" in the table, in column 309.

FIG. 3 shows, by way of example, possible signal state pairs during the bit-parallel transfer of three directly successive data words DW1, DW2 and DW3 and also the control signals—generated depending on the type and number of the state changes within the signal state pairs—for driving the additional driver stages 41, 42, 43 and 44. The data word DW1 in column 302 has a bit pattern of four logic "0000" to be transferred, the individual bits being transferred in parallel and simultaneously via the signal lines S1, S2, S3 and S4.

The consideration hereinafter assumes that the data word DW1 is already present at the output terminals O1, O2, O3 and O4. At each of its inputs 21, 22, 23 and 24, the control device 2 has established the states of the data signals—representing the bits—of the first data word DW1.

Proceeding from the data word DW1 already transferred, in accordance with column 301, the control device 2 establishes the bit pattern of the second data word DW2 that follows directly in column 302. Data word DW2 in column 302 has a bit pattern of "0100", which is again transferred bitwise in parallel and simultaneously via the signal lines S1, S2, S3 and S4, so that the control device 2 establishes, including the already effected transfer of the data word DW1, on a respective one of the signal lines S1, S2, S3 and S4, the signal state pairs with the states "00", "01", "00" and "00" represented in column 305. As can be seen from column 307, the control device determines, for each signal state pair, whether a signal state change is present within the signal state pairs. Consequently, in the case of the two directly successive data words DW1 and DW2, a signal state change is present only on the signal line S2.

A data word DW3 that is to be communicated directly after data word DW2 has a bit pattern of "1010". On the basis of the data signals transferred directly beforehand, the control device 3 determines the signal state pairs with the states "01", "10", "01" and "00" represented in column 306, so that, as can be seen from column 308, there is a respective signal state change present within the signal state pairs on the signal lines S1, S2 and S3.

The control device 2 generates a control signal depending on the type and number of the signal state changes relating to the bit-parallel data signals of two data words transferred directly in succession.

The amplifier stages 31, 32, 33 and 34, as illustrated in column 310, are switched on, in principle, while the amplifier stages 41, 42, 43 and 44, whose switching states are represented in column 311 in each case for the transfer of the data words DW2 and DW3, are connected or disconnected depending on the generated control signals of the control device 2, in accordance with column 309. In the present example, during the transfer of the third data word DW3, signal state changes are present in parallel on three signal lines S1, S2 and S3. The control device 2 establishes that three signal state pairs with a signal state change are present simultaneously. However, the control device 2 only generates two control signals since, in the predetermined case, amplification is provided only for the majority of signal state pairs present with a signal state change of the same type, in accordance with column 309, on the signal lines S1 and S3, for driving the driver stages 41 and 43. The driver stages 41 and 43 are switched on and perform additional amplification of the data signals—representing the bits—of the data word DW3 on the signal lines S1 and S3.

Figure 4:
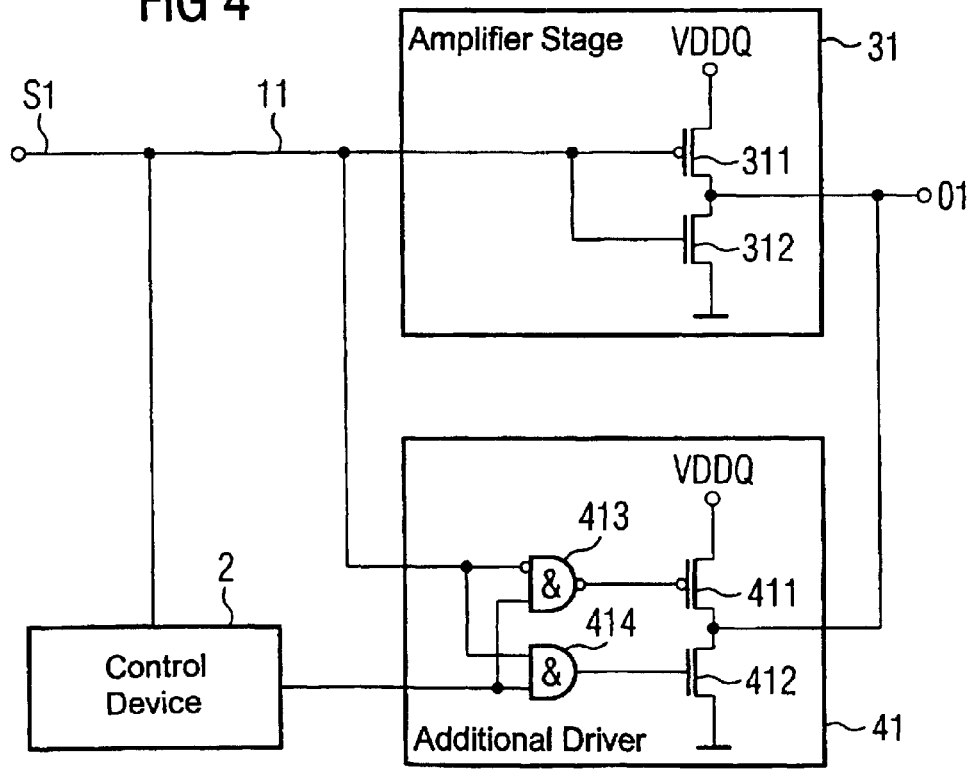
FIG. 4 is an exemplary embodiment of an amplifier stage controlled via a reference circuit.

FIG. 4 shows a possible embodiment of an output driver of a signal line S1 comprising the two amplifier stages 31 and 41. The inputs and the outputs of the two amplifier stages 31 and 41 are connected in parallel. The amplifier stages 31 and 41 have complementary field-effect transistors 311, 312 and 411, 412 of a p-channel type and an n-channel type which are connected in series. The p-channel field-effect transistors 311 and 411 are connected to the voltage potential VDDQ via their source terminals and the n-channel field-effect transistors 312 and 412 are connected to the reference-ground potential VSSQ via their source terminals. The coupling nodes of the drain terminals of the field-effect transistors 311, 312 and 411, 412 are connected in parallel and serve as the output of the amplifier stage.

The data signal 11 representing a bit is fed to the series circuit of the field-effect transistors 311 and 312 directly, to the p-channel field-effect transistor 411 via a logic NAND gate 413 and to the n-channel field-effect transistor 412 via an AND gate 414. The data signal is inverted at an input of the NAND gate 413. The further inputs of the logic combination elements 413 and 414 are connected to the control device 2 for feeding a control signal.

In order to simplify the following explanations, rising edges are designated by logic "1" and falling edges by logic "0".

The p-channel field-effect transistors 311 and 411 turn on if a logic "0" is present at their gate terminals; they turn off if a logic "1" is present at their gate terminals. The n-channel field-effect transistors 312 and 412 turn on if a logic "1" is present at their gate terminals; they turn off if a logic "0" is present at their gate terminals.

As already described in the explanations of FIG. 2, the reference circuit 2 generates a control signal for driving the gate terminals of the field-effect transistors 411 and 412. The data signal of the signal line S1 and the control signal generated by the reference circuit 2 are fed to the inputs of the logic combination elements 413 and 414.

If the data signal has a logic "1", then a logic "1" is present at the gate terminals of the field-effect transistors 311 and 312, so that the field-effect transistor 312 turns on; if the data signal has a logic "0", then a logic "0" is present at the gate terminals of the field-effect transistors 311 and 312, so that the field—effect transistor 311 turns on.

A data signal with a logic "1" is inverted to form a logic "0" at the input of the NAND gate 413. If the control signal of the reference circuit 2 that is fed to the NAND gate 413 has a logic "0" or a logic "1", then the combination of the NAND gate 413 produces a logic "1" at the output and the field-effect transistor 411 turns off. A logic "0" is present at the input of the field-effect transistor 411 only when the data signal 11 has a logic "0" and the control signal has a logic "1", so that the transistor turns on and effects additional amplification of the data signal 11.

The combination of the signals fed to the AND gate 414 produces a logic "1" at its output only for the case in which both the data signal 11 and the control signal of the reference circuit 2 have a logic "1", so that the field-effect transistor 412 turns on and effects additional amplification of the data signal.

The amplified data signal is output via the output terminal 01 to the metallic pads situated in the topmost metallization plane of the semiconductor chip. Contact is made between the pads and the terminal pins of the housing via bonding wires.

We claim:

1. A circuit configuration for outputting bits of a data word in parallel, the configuration comprising:
   a plurality of signal lines for providing data signals in parallel representing at least two bits of a data word, the data word including at least two bits;
   a plurality of output terminals for providing amplified data signals representing the bits of the data word;
   a control device having at least two outputs for outputting a respective control signal, said control device having at least two inputs connected to said signal lines, said control device for determining signal states of data signals representing bits of two directly successive data words on said plurality of signal lines;
   a plurality of driver stages having inputs for obtaining the data signals from said plurality of signal lines, said plurality of driver stages having outputs connected to said plurality of output terminals; and
   a plurality of additional driver stages, connected in parallel with said inputs and said outputs of said plurality of said driver stages, each one of said plurality of additional driver stages connected in parallel with a respective one of said plurality of said driver stages;
   said control device for generating a plurality of control signals for enabling or switching off said plurality of additional driver stages; and
   each one of said plurality of said additional driver stages having an input connected to a respective one of said outputs of said control device for receiving one of said plurality of control signals generated by said control device.

2. The circuit configuration according to claim 1, wherein:
   at each of said inputs of said control device, said control device is configured for determining signal state pairs comprised of a first data signal representing a bit of a data word and a second data signal representing a bit of an immediately successive data word; and
   said signal state pairs include:
      a rising edge of said first data signal followed by a falling edge of said second data signal, and
      a falling edge of said first data signal followed by a rising edge of said second data signal.

3. The circuit configuration according to claim 2, wherein:
   if said control device determines that two of said signal state pairs are simultaneously present, then said control device forwards a control signal to one of said plurality of additional driver stages assigned to one of said plurality of signal lines for which one of said signal state pairs has been determined;
   if said control device determines that three of said signal state pairs are simultaneously present, then said control device forwards a respective control signal for two identical ones of said signal state pairs to ones of said plurality of additional driver stages assigned to ones of said plurality of signal lines for which said two identical ones of said signal state pairs have been determined; and
   if said control device determines that more than three of said signal state pairs are simultaneously present, then said control device forwards a respective control signal to each of said plurality of additional driver stages assigned to ones of said plurality of signal lines for which one of said signal state pairs has been determined.

4. The circuit configuration according to claim 3, wherein said plurality of additional driver stages are driven directly before transferring a second bit of a signal state pair.

5. The circuit configuration according to claim 1, wherein each one of said plurality of additional driver stages is driven by a respective one of the data signals provided by said plurality of said signal lines and by a respective one of said plurality of control signals generated by said control device.

* * * * *